United States Patent
Hsieh et al.

(10) Patent No.: US 11,530,804 B2
(45) Date of Patent: Dec. 20, 2022

(54) LIGHT-EMITTING DEVICE

(71) Applicant: EPISTAR CORPORATION, Hsinchu (TW)

(72) Inventors: Min-Hsun Hsieh, Hsinchu (TW); Ying-Yang Su, Hsinchu (TW); Shih-An Liao, Hsinchu (TW); Hsin-Mao Liu, Hsinchu (TW); Tzu-Hsiang Wang, Hsinchu (TW); Chi-Chih Pu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 51 days.

(21) Appl. No.: 17/153,050

(22) Filed: Jan. 20, 2021

(65) Prior Publication Data

US 2021/0222861 A1    Jul. 22, 2021

(30) Foreign Application Priority Data

Jan. 22, 2020 (TW) ................. 109102633

(51) Int. Cl.
| | |
|---|---|
| *F21V 23/00* | (2015.01) |
| *H01L 25/075* | (2006.01) |
| *H01L 33/62* | (2010.01) |
| *H01L 25/16* | (2006.01) |
| *F21Y 115/10* | (2016.01) |

(52) U.S. Cl.
CPC ........ *F21V 23/005* (2013.01); *H01L 25/0753* (2013.01); *H01L 25/167* (2013.01); *H01L 33/62* (2013.01); *F21Y 2115/10* (2016.08)

(58) Field of Classification Search
CPC . F21V 23/005; H01L 25/0753; H01L 25/167; H01L 33/62; F21Y 2115/10; G09F 9/33
See application file for complete search history.

(56) References Cited

U.S. PATENT DOCUMENTS

| | | | |
|---|---|---|---|
| 9,936,177 B2 | 4/2018 | Hickl | |
| 10,012,368 B2 | 7/2018 | Patterson et al. | |
| 2014/0062316 A1* | 3/2014 | Tischler | F21V 23/02 315/185 R |
| 2019/0086705 A1 | 3/2019 | Wu et al. | |

FOREIGN PATENT DOCUMENTS

CN          108777114 B     5/2021

* cited by examiner

*Primary Examiner* — Anne M Hines
*Assistant Examiner* — Jose M Diaz
(74) *Attorney, Agent, or Firm* — Patterson + Sheridan, LLP

(57) ABSTRACT

A light-emitting device includes a first light-emitting module, a second light-emitting module, a conductive layer and an insulation layer. The first light-emitting module includes a first substrate having a first cavity, a first sidewall, and a light-emitting component disposed on the first substrate. The second module includes a second substrate having a second cavity corresponding to the first cavity and a second sidewall corresponding to the first sidewall. The conductive layer is directly connected to the first cavity and the second cavity and electrically connect the first light-emitting module and the second light-emitting module. The insulation layer is directly connected to the first sidewall and the second sidewall.

19 Claims, 10 Drawing Sheets

LIGHT-EMITTING DEVICE

RELATED APPLICATION DATA

This application claims the right of priority of TW Application No. 109102633, filed on Jan. 22, 2020, and the content of which is hereby incorporated by reference in its entirety.

TECHNICAL FIELD

The present application is related to a light-emitting device made by assembling a plurality of light-emitting modules and manufacturing methods thereof, and especially related to a light-emitting device made by assembling a plurality of light-emitting modules which include glass substrates and manufacturing methods thereof.

DESCRIPTION OF BACKGROUND ART

In order to improve the brightness/contrast of the display, the local dimming technology is gradually applied to a variety of light-emitting devices such as the displays. However, in order to implement the local dimming technology, the number of the light-emitting diodes applied to the light-emitting devices should be increased several times and therefore the production yield thereof is reduced.

In order to improve the production yield of manufacturing, the light-emitting devices can be assembled together by smaller light-emitting modules which have higher production yields. The number of the light-emitting diodes on the light-emitting module is relatively small and therefore the production yield is higher.

SUMMARY OF THE DISCLOSURE

The present application discloses a light-emitting device including a first light-emitting module, a second light-emitting module, a light-emitting diode, a conductive layer, and an insulation layer. The first light-emitting module includes a first substrate including a first cavity and a first sidewall. The second light-emitting module includes a second substrate including a second cavity corresponding to the first cavity and a second sidewall corresponding to the second sidewall. The light-emitting diode is disposed on the first substrate. The conductive layer is directly connected to the first cavity and the second cavity and electrically connected to the first light-emitting module and the second light-emitting module. The insulation layer is directly connected to the first sidewall and the second sidewall.

The present application also discloses a light-emitting device including a first light-emitting module, a second light-emitting module, a light-emitting diode, and a conductive material. The first light-emitting module includes a first substrate including a cavity and a first sidewall. The second light-emitting module includes a second substrate including a second sidewall corresponding to the cavity and the first sidewall. The light-emitting diode is arranged on the first substrate. The conductive material is directly connected to the cavity and the sidewalls and electrically connected to the first light-emitting module and the second light-emitting module.

DETAILED DESCRIPTION OF PREFERRED EMBODIMENTS

Figure 1:
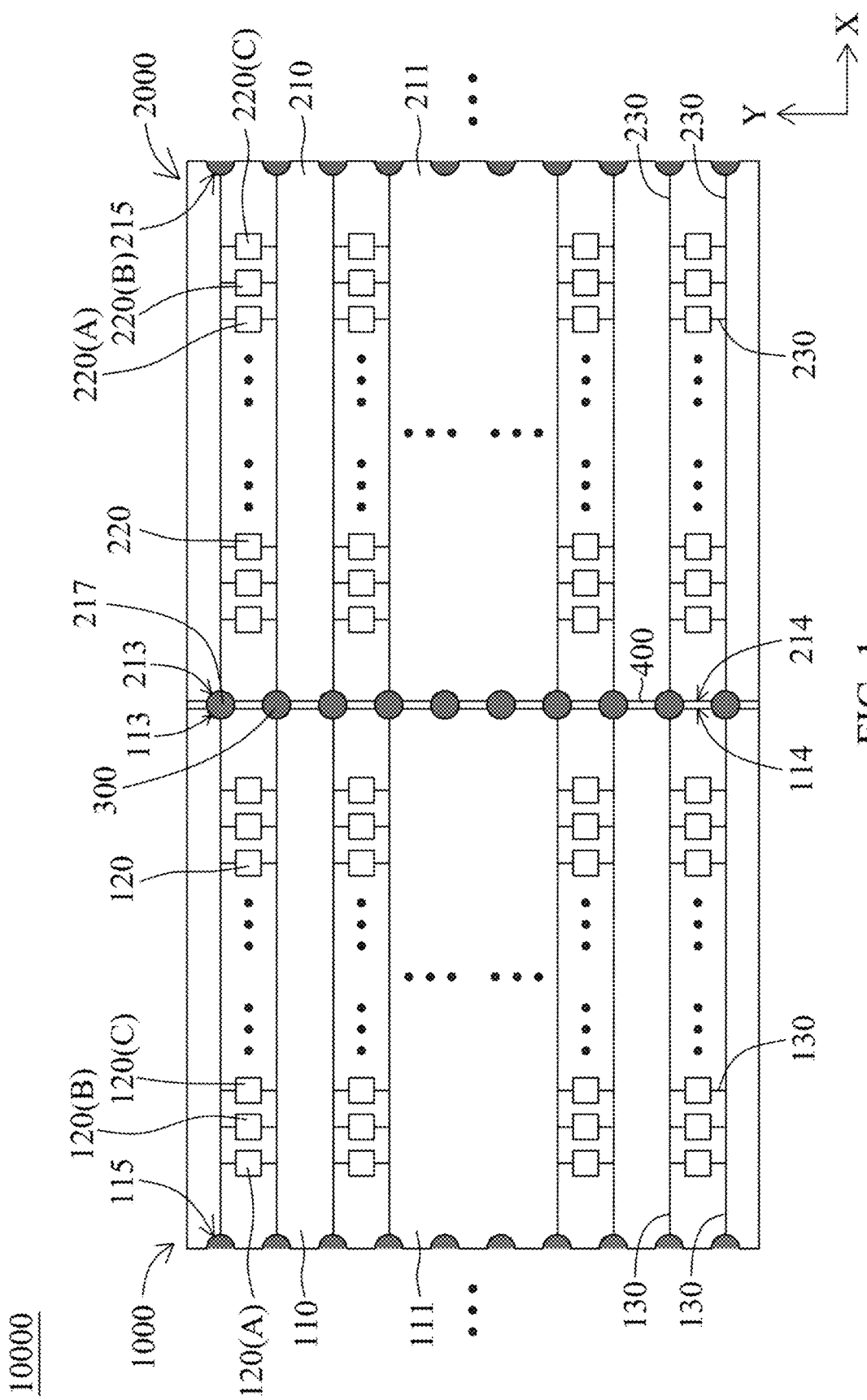
FIG. 1 shows a schematic diagram of a light-emitting device in accordance with one embodiment of the present application.

The embodiments of the present application are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art.

FIG. 1 discloses a light-emitting device in accordance with one embodiment of the present application. Light-emitting devices are, for example, backlight modules of multiple light-emitting components such as Light-emitting Diode (LED) chips and/or LED packages and/or light-emitting diode wafer-level packages. FIGS. 2A~2F, 3A~3B disclose processes of manufacturing a light-emitting module and a light-emitting device. The manufacturing process in accordance with this embodiment can assemble more than one light-emitting module into a light-emitting device.

Referring to FIG. 1, the light-emitting device 10000 includes a first light-emitting module 1000 and a second light-emitting module 2000, and the first light-emitting module 1000 and the second light-emitting module 2000 are electrically connected to each other through a conductive layer 300 and mechanically connected to each other through an insulation layer 400 in order to improve the strength of the connection therebetween. The first light-emitting module 1000 includes a first substrate 110, a first circuit 130, and a first light-emitting component 120 (such as the light-emitting component 120A, 120B, and 120C) arranged on the first substrate 110. The second light-emitting module 2000 includes a second substrate 210, a second circuit 230, and a second light-emitting component 220 (such as the light-emitting component 220A, 220B, and 220C) arranged on the second substrate 210. The light-emitting device 10000 can be connected with a power supply (not shown) so that the power supply can supply power to the first and second light-emitting components 120, 220 through the first and second circuits 130, 230. More specifically, the electrodes (not shown) of the first and second light-emitting components 120, 220 are connected to the first and second circuits 130, 230 through conductive adhesive materials such as solder (not shown) so that the first and second light-emitting components 120, 220 emit light by receiving the current provided by the power supply through the electrodes. In one embodiment, driving elements (not shown, such as thin film transistors and driver ICs) are arranged on the first light-emitting module 1000 and the second light-emitting module 2000. The driving elements are respectively located between the first circuit 130 and the first light-emitting component 120 and/or between the second circuit 230 and the second light-emitting component 220 for controlling the first light-emitting component 120 and the second light-emitting component 220 which are connected to the driving element. In one embodiment, the main composition of circuits 130, 230 are metals (such as copper (Cu), tin (Sn), gold (Au), silver (Ag), titanium (Ti), chromium (Cr), platinum (Pt), and nickel (Ni)) or transparent conductive materials (such as ITO, IZO, and GZO). In one embodiment, the light-emitting device 10000 further includes a driving circuit (not shown) which includes passive components and active components. Passive components include resistances and capacitances, and active components include transistors and control ICs. The driving circuit can be arranged on both of the first substrate 110 and the second substrate 210, or the drive circuit can be arranged only on the first substrate 110 or the second substrate 210. The driving circuit may simultaneously drive a single light-emitting component or multiple light-emitting components (such as the first light-emitting component 120A and/or the second light-emitting component 220A) located in the same column, or drive a single light-emitting component or multiple light-emitting components located in different columns at the same time. As mentioned earlier, the first and second light-emitting components 120, 220 are LED chips and/or LED packages and/or CSPs. For simplicity, unless otherwise noted, the symbol 120 represents more than one first light-emitting component 120, while a specific first light emitting component 120 can be represented by adding a letter after symbol 120, such as 120A. Similarly, the symbol 220 represents multiple second light-emitting components 220, while a specific second light-emitting component 220 can be represented by adding a letter after symbol 220, such as 220A. In one embodiment, the first and second light-emitting modules 1000 and 2000 further include driving elements (not shown) located between the first and second circuits 130, 230 and multiple light-emitting components (such as first and second light-emitting components 120, 220), so that these light-emitting components (first and second light-emitting components 120, 220) can be turned on or off by the driving elements. In one embodiment, the light-emitting device 10000 further includes a protective layer (not shown) covering and directly contacting with the first and second light-emitting components 120, 220, substrates 110, 210, and the conductive layer 300, and a certain proportion of the emitted light of the first and second light-emitting components 120, 220 can pass through the protective layer. In one embodiment, at least 40% of the light emitted by the first and second light-emitting components 120, 220 can pass through the protective layer without being absorbed.

The first substrate 110 includes a first top surface 111, a first cavity 113, a second cavity 115, and a first sidewall 114. The first cavity 113 and the second cavity 115 are respectively located at both sides of the first substrate 110. The first light-emitting component 120 and the first circuit 130 are located between the first cavity 113 and the second cavity 115, and the first light-emitting component 120 is connected to the first circuit 130 through conductive adhesive materials such as solder (not shown). Similarly, the second substrate 210 includes a second top surface 211, a third cavity 213, a fourth cavity 215, and a second sidewall 214. The third cavity 213 and the fourth cavity 215 are respectively located at both sides of the second substrate 210. The second light-emitting component 220 and the second circuit 230 are located between the third cavity 213 and the fourth cavity 215, and the second light-emitting component 220 is connected to the second circuit 230 through conductive adhesive materials such as solder (not shown).

Referring to FIG. 1, the first cavity 113 is corresponding to the third cavity 213 and forming a through hole 217 penetrating the first substrate 110 and the second substrate 210. A conductive layer 300 is arranged in the through hole 217 and extending outwardly to connect the first and second circuits 130, 230, so that the conductive layer 300 is electrically connected to the light-emitting components which are arranged on the first light-emitting module 1000 and the second light-emitting module 2000. The through hole 217 is capable of limiting the volume and the extending region of the conductive layer 300, so that the protruded thickness the conductive layer 300 protruding from the first and second top surfaces 111, 211 of the first and second substrate 110, 210 can be controlled more effectively in order to avoid the conductive layer 300 from overflowing on the first and second substrate 110, 210 and touching the circuits that supposed not be connected. Besides, the through hole 217 is capable of increasing both the contact area between the conductive layer 300 and the first light-emitting module 1000 and the contact area between the conductive layer 300 and the second light-emitting module 2000 so that the first light-emitting module 1000 and the second light-emitting module 2000 are connected more tightly.

Figure 4A:
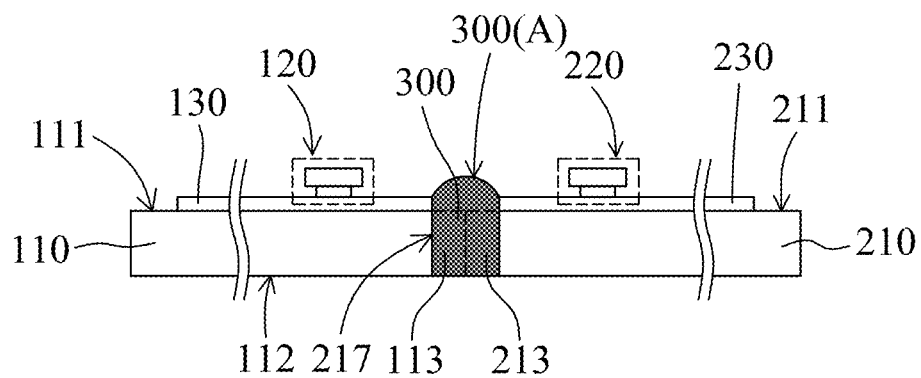
FIG. 4A shows a cross-sectional view of a light-emitting device disclosed in FIG. 3B.
Figure 4B:
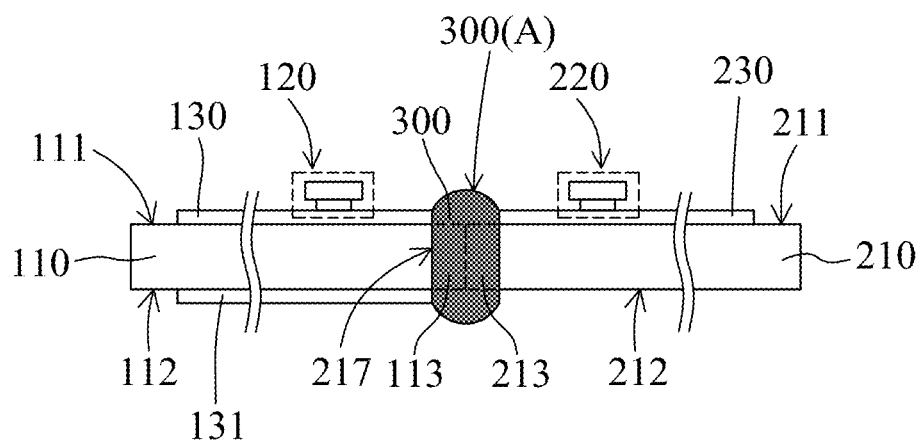
FIGS. 4B~4C show cross-sectional views of light-emitting devices in accordance with two embodiments of the present application.
Figure 4C:
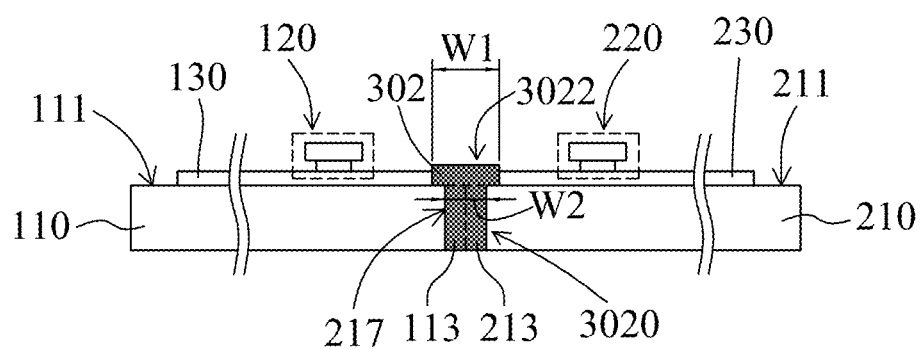

Besides, the through hole 217 allows the cured conductive layer 300 to remain in the through hole 217 and to protrude from the top surfaces and the bottom surfaces of the light-emitting modules 1000, 2000, so that the conductive layer 300 is capable of making electrical connections with the external circuits (see subsequent FIGS. 4A~4C). In the manufacturing process, different through holes 217 are tested to confirm if the connections with the external circuits are connected precisely. Compared with the design having the external circuits disposed at the sidewall(s) of the light-emitting modules that form the electrical connection with the conductive adhesive materials at the sidewalls, when the connection is found inaccurately connected in the present application, the conductive adhesive materials can be supplemented to the through holes 217 to correct the problem without separating the two light-emitting modules 1000, 2000.

Still referring to FIG. 1, the first sidewall 114 is corresponding to the second sidewall 214, and the first sidewall 114 and the second sidewall 214 are connected by an insulation layer 400 composed of insulation material such as glass glue. The insulation layer 400 can strengthen the connection strength between the first light-emitting module 1000 and the second light-emitting module 2000. In one embodiment, there is no insulation layer 400 formed between the first and second light-emitting modules 1000, 2000. The light-emitting modules 1000, 2000 are electrically connected to each other only through the conductive layer 300 and the sidewall of the first substrate 110 is in direct contact with the sidewall of the second substrate 210.

In the embodiment, the inner surface of the first cavity 113 and the first sidewall 114 are smooth surfaces and are connected to each other, the inner surface of the third cavity 213 and the second sidewall 214 are smooth surfaces which are connected to each other, the first circuit 130 located on the top surface 111 is adjacent to the first cavity 113 and the second circuit 230 located on the top surface 211 is adjacent to the third cavity 213. In another embodiment, the inner surface of the first cavity 113 and/or the first sidewall 114 are non-smooth surfaces. A non-smooth surface has larger surface area that can enhance the connection strength between the adjacent light-emitting modules. More specifically, when the inner surface of the first cavity 113 and/or the inner surface of the first sidewall 114 is a non-smooth surface caused by a manufacturing process such as breaking process, such non-smooth surface has larger surface area than that of a smooth surface so that the contact area between the first substrate 110 and the conductive layer 300 and the contact area between the first substrate 110 and the insulation layer 400 are enlarged and therefore the connection strength between the light-emitting module 1000 and other light-emitting modules is enhanced. Similarly, in order to provide a better connection strength, the inner surface of the third cavity 213 and/or the inner surface of the second sidewall 214 can also be subjected to the same process to form a non-smooth surface(s).

In one embodiment, similar to the aforementioned through hole 217, one through hole (not shown) is formed by the second cavity 115 which is located at a side of the first substrate 110 opposite to the side where the first cavity 113 is located and the corresponding cavity of another light-emitting module (not shown) which is adjacent to the side where the second cavity 115 is located so that the first light-emitting module 1000 can be connected to the light-emitting module located at another side in a manner similar to that of the second light-emitting module 2000. Similarly, in one embodiment, one through hole (not shown) is formed by the fourth cavity 215 which is located at a side of the second substrate 210 opposite to the side where the third cavity 213 is located and the corresponding cavity of another light-emitting module (not shown) which is adjacent to the side where the fourth cavity 215 is located so that the second light-emitting module 2000 can be connected to the light-emitting module located at another side in a manner similar to that of the first light-emitting module 1000. In one embodiment, the insulation layer 400 includes insulation material such as silica, silicon dioxide, silicone, and epoxy resin. In one embodiment, the insulation layer 400 includes a light-transmissive material such as glass glue. In one embodiment, more than 80% of the light emitted by the light-emitting components can pass through the insulation layer 400 without being absorbed to enhance the luminous intensity of the light-emitting device 10000.

The first light-emitting component 120 and the second light-emitting component 220 may include light-emitting diodes composed of the semiconductor layers formed by III-V semiconductor materials to emit an incoherent light. For example, the III-V semiconductor material is $Al_xIn_yGa_{(1-x-y)}N$ or $Al_xIn_yGa_{(1-x-y)}P$, and wherein $0 \leq x \leq 1$; $0 \leq y \leq 1$; and $x+y \leq 1$. The first light-emitting component 120 and the second light-emitting component 220 can emit light with peak wavelength falling in the same range or in different ranges. Depending on the semiconductor materials, the first light-emitting component 120 and the second light-emitting component 220 can emit red light with peak wavelength between 610 nm and 650 nm, green light with peak wavelength between 495 nm and 570 nm, blue light with peak wavelength between 450 nm and 495 nm, purple light with peak wavelength between 400 nm and 440 nm, or ultraviolet light with peak wavelength between 200 nm and 400 nm.

In one embodiment, each of the first light-emitting component 120 and the second light-emitting component 220 has a light-emitting layer and a wavelength conversion material formed thereon, the wavelength conversion material includes a quantum dot material, a phosphor material, or a combination thereof. The phosphor material can be a yellow-green phosphor, a red phosphor, or a blue phosphor. For example, the yellow-green phosphor includes YAG, TAG, silicate, niobate, alkaline earth metal selenium, or metal nitride. For example, the red phosphor includes fluoride (such as $K_2TiF_6:Mn^{4+}$ or $K_2SiF_6:Mn^{4+}$), silicate, niobate, alkaline earth metal sulfide, metal oxynitride, and a mixture of tungstate and molybdate. For example, the blue phosphor includes $BaMgAl_{10}O_{17}:Eu^{2+}$. For example, the quantum dot material includes zinc sulfide, zinc selenide, zinc telluride, zinc oxide, cadmium sulfide, cadmium selenium, cadmium telluride, gallium nitride, gallium phosphide, gallium selenide, gallium antimonide, gallium arsenide, aluminum nitride, aluminum phosphide, aluminum arsenide, indium phosphide, indium arsenide, tellurium, lead sulfide, indium antimonide, lead telluride, lead selenide, antimony telluride, ZnCdSeS, CuInS, $CsPbCl_3$, $CsPbBr_3$, $CsPbI_3$. In an embodiment of a display backlight module, the backlight module includes a first light-emitting component 120 with a wavelength conversion layer and a second light-emitting component 220, and the first light-emitting component 120 and the second light-emitting component 220 cooperatively emit a white light. Wherein the white light has a color temperature between 10000K and 20000K and has a color point coordinates (x, y) in CIE1931 Chroma Map; wherein $0.27 \leq x \leq 0.285$; and $0.23 \leq y \leq 0.26$. In an embodiment of a lighting apparatus, the white light emitted by the first light-emitting component 120 and the second light-emitting component 220 has a color temperature between 2200 and 6500K (such as 2200K, 2400K, 2700K, 3000K, 5700K, 6500K) and has a color point coordinates (x, y) in CIE1931 Chroma Map located in seven steps MacAdam ellipse.

The first substrate 110 and the second substrate 210 are substrates for carrying the first light-emitting components 120 and the second light-emitting components 220. In one embodiment, the first substrate 110 and the second substrate 210 are flexible substrates that can be fully/partially restored to their original shape after being stretched or bent, such as a flexible printed circuit boards (FPC) which uses polyimide (PI) or polyester (PET) as the base material. In one embodiment, the first substrate 110 and the second substrate 210 are light-transmissive substrates, which allow more than 80% of the light emitted by the light-emitting component pass through the substrate, such as a sapphire substrate or a glass substrate. The conductive layer 300 electrically connects the first light-emitting module 1000 and the second light-emitting modules 2000. In one embodiment, the conductive layer 300 includes metal and resin. The metal can be copper, tin, gold, silver, titanium, chromium, platinum, nickel, and alloy of the above materials, and the resin can be epoxy resin, silicone resin, phenol resin, unsaturated polyester resin, and polyimide resin.

Figure 2A:
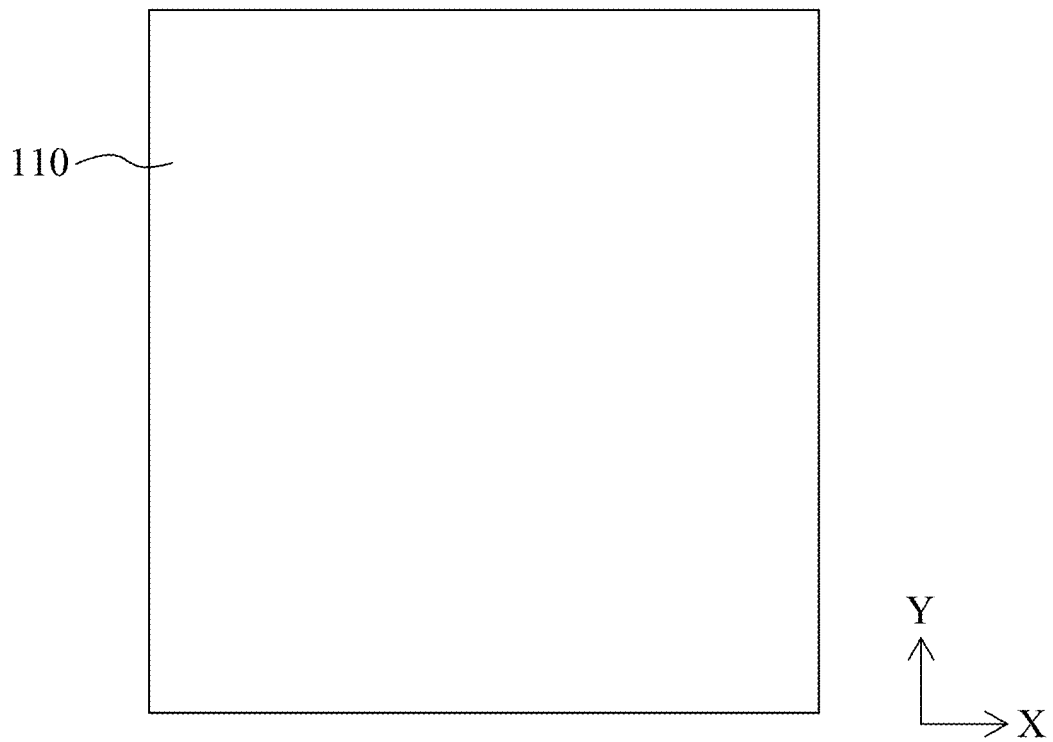
FIGS. 2A~2F show schematic diagrams of a process of manufacturing a light-emitting module in accordance with one embodiment of the present application.
Figure 2B:
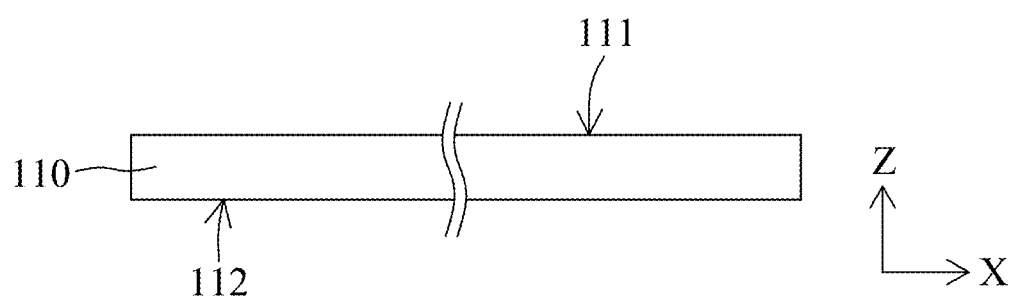

FIGS. 2A~2F are schematic diagrams of the manufacturing process of the light-emitting module in accordance with an embodiment of the present application. Referring to FIGS. 2A·2B, the first substrate 110 is provided. FIG. 2A shows the top view of the first substrate 110 and FIG. 2B shows the side view of the first substrate 110. The first substrate 110 has a first top surface 111 and a first bottom surface 112 opposite to the first top surface 111.

Figure 2C:
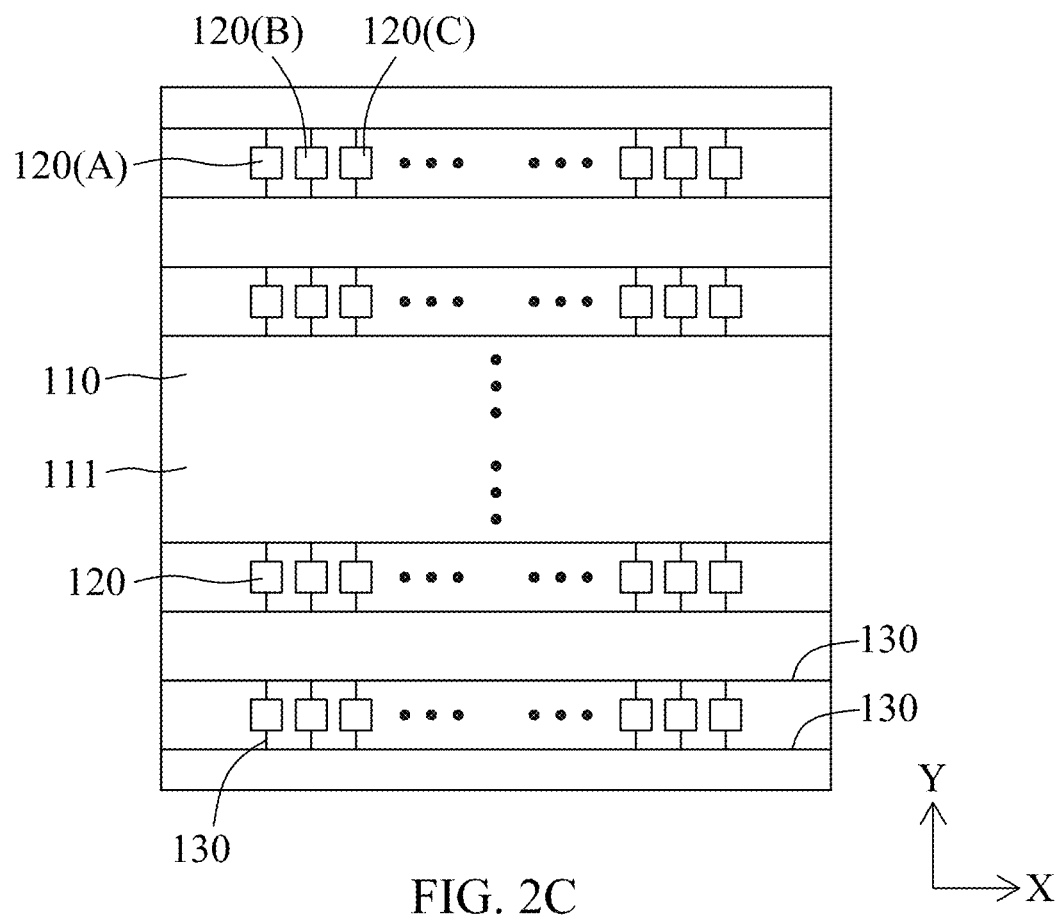
Figure 2D:
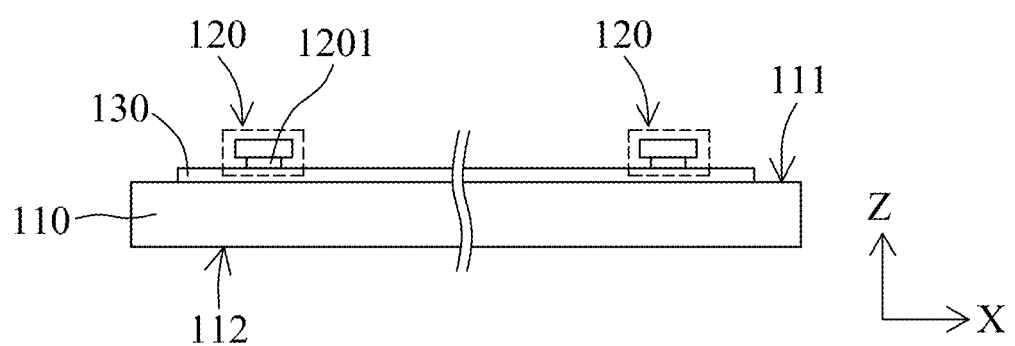

FIG. 2C shows a top view of a manufacturing process of the first light-emitting module 1000. After the first circuit 130 is arranged on the first top surface 111 of the first substrate 110, the connection portions where the first circuit 130 and the first light-emitting components 120 (such as the first light-emitting component 120A, 120B, 120C) are electrically connected is covered with the conductive adhesive material such as solder (not shown), and then the first light-emitting component is attached to the first circuit 130 by curing the conductive adhesive material so that the first light-emitting component 120 and the first circuit 130 are electrically connected. In one embodiment, the conductive adhesive material is, for example, an anisotropic conductive paste (ACP) or an anisotropic conductive film (ACF). FIG. 2D shows a side view of FIG. 2C. The first light-emitting component 120 includes an electrode 1201. From the perspective of view, only one electrode 1201 in the first light-emitting component 120 is shown. However, the first light-emitting component 120 can have two or more electrodes to receive the external power. The electrode 1201 is connected to the first circuit 130 through the conductive adhesive material such as solder which is composed of the above-mentioned material(s). In one embodiment, the first substrate 110 is, for example, a light-transmissive material such as glass, and more than 80% of the light emitted by the light-emitting component can pass through the first substrate 110.

In FIGS. 2C~2D, the first light-emitting component 120 is fixed to the first circuit 130 through curing a conductive adhesive material (not shown) such as solder. More specifically, the curing step includes a heating step. In addition to heating the first substrate 110, the first circuit 130, the first light-emitting component 120, and the conductive adhesive material (not shown) simultaneously, the conductive adhesive material at a specific position (not shown) can also be heated by laser. In one embodiment, when the first light-emitting component 120 on the first top surface 111 is in direct contact with the conductive adhesive material (not shown) on the first circuit 130, a laser irradiates the first circuit 130 in the direction from the first bottom surface 112 toward the first top surface 111 so that the temperature of the first circuit 130 which is irradiated by the laser rises, and then the conductive adhesive material (not shown) on the first circuit 130 is heated and cured. In this embodiment, the first substrate 110 is a light-transmissive material, such as glass and about 80% or more of the laser light can pass through the first substrate 110, which does not easily absorb the laser light. Therefore, the temperature of the first substrate 110 rises less to avoid the warpage and deformation. In another embodiment, a laser irradiates in the direction from the first top surface 111 toward the first bottom surface 112 to the conductive adhesive material (not shown) and/or the first circuit 130 so that the temperature of the conductive adhesive material and/or the first circuit 130 which is irradiated by the laser rises, and the conductive adhesive material is heated and cured. Laser can pass through the first light-emitting component 120 to irradiate the conductive adhesive material and/or the first circuit 130 at an almost vertical angle or at a tilted angle. In one embodiment, the first light-emitting component 120 can emit a green light with a peak wavelength between 495 nm and 570 nm, a blue light with a wavelength between 450 nm and 495 nm, a purple light with a peak wavelength between 400 nm and 440 nm, or an ultraviolet light with a peak wavelength between 200 nm and 400 nm, while the peak wavelength of the laser light is between 700 and 1400 nm, such as 980 nm, 1020 nm or 1064 nm.

Figure 2E:
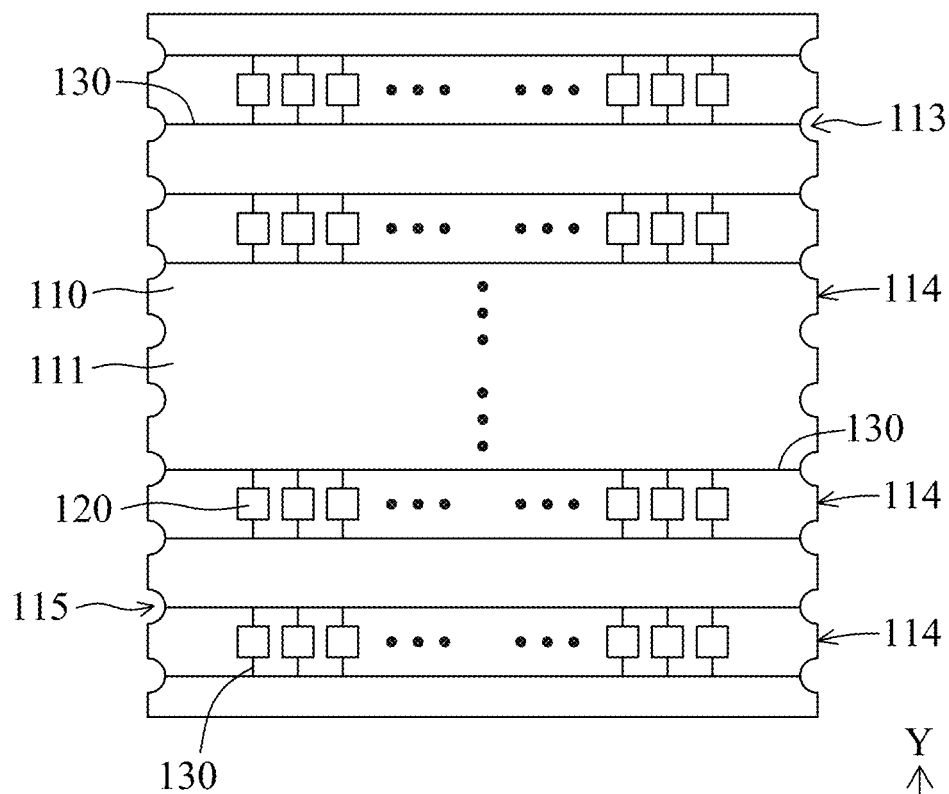
Figure 2F:
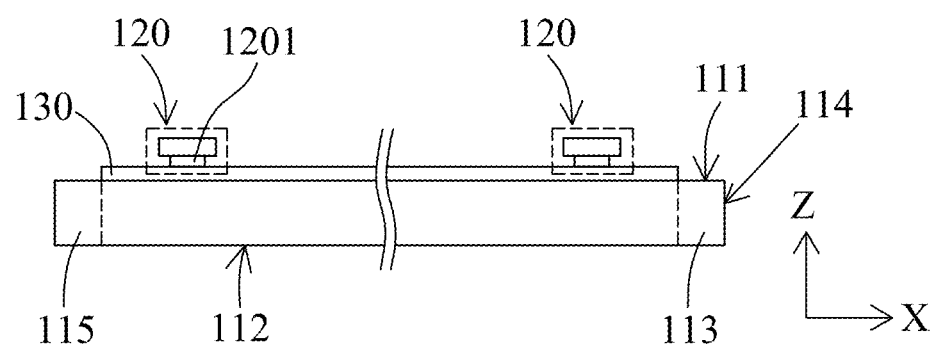

FIG. 2E shows a top view of the first light-emitting module 1000. In FIG. 2E, after the first light-emitting component 120 is fixed on the first top surface 111 of the first substrate 110, a portion of the first substrate 110 is removed along both the sidewalls 114 of the first substrate 110 to form the first cavities 113 and the second cavities 115. In the process of forming the cavities 113 and 115, a part of the first circuit 130 is removed so that the remaining first circuit 130 located on the top surface 111 is adjacent to the first cavities 113 and the second cavities 115. In another embodiment, the positions of the cavities 113 and 115 and the positions of the first circuit 130 can be staggered so that the first circuit 130 is intact during the formation of the cavities. FIG. 2F shows a side view of FIG. 2E. In FIG. 2F, the first cavity 113 penetrates the first substrate 110 and extends from the first top surface 111 to the first bottom surface 112. There is a distance between the first cavity 113 and the first light-emitting component 120 so that the first light-emitting component 120 does not overlap with the first cavity 113 in the side view (or in the top view as shown in FIG. 2E). The second cavity 115 on the other side of the first substrate 110 is also formed through a manufacturing process similar to that of the first cavity 113. The related description can be referred to the previous paragraphs. Therefore, the second cavity 115 also penetrates the first substrate 110 and does not overlap with the first light-emitting component 120. The related description can be referred to the previous paragraphs. In one embodiment, a driving element (not shown) is further provided on the first top surface 111 to connect the first circuit 130 and the first light-emitting component 120 to control the turning on or off of the first light-emitting component 120. In one embodiment, the first light-emitting module 1000 further includes a driving circuit (not shown) on the first top surface 111 and/or below the first bottom surface 112. The related description of the driving circuit can be referred to the previous paragraphs. In one embodiment, the light-emitting module 1000 further includes a protective layer (not shown) covering and directly contacting the first light-emitting component 120 and the first substrate 110, and the protective layer is a light-transmissive material. In one embodiment, at least 40% of the light emitted by the first light-emitting component 120 can pass through the protective layer without being absorbed.

Figure 3A:
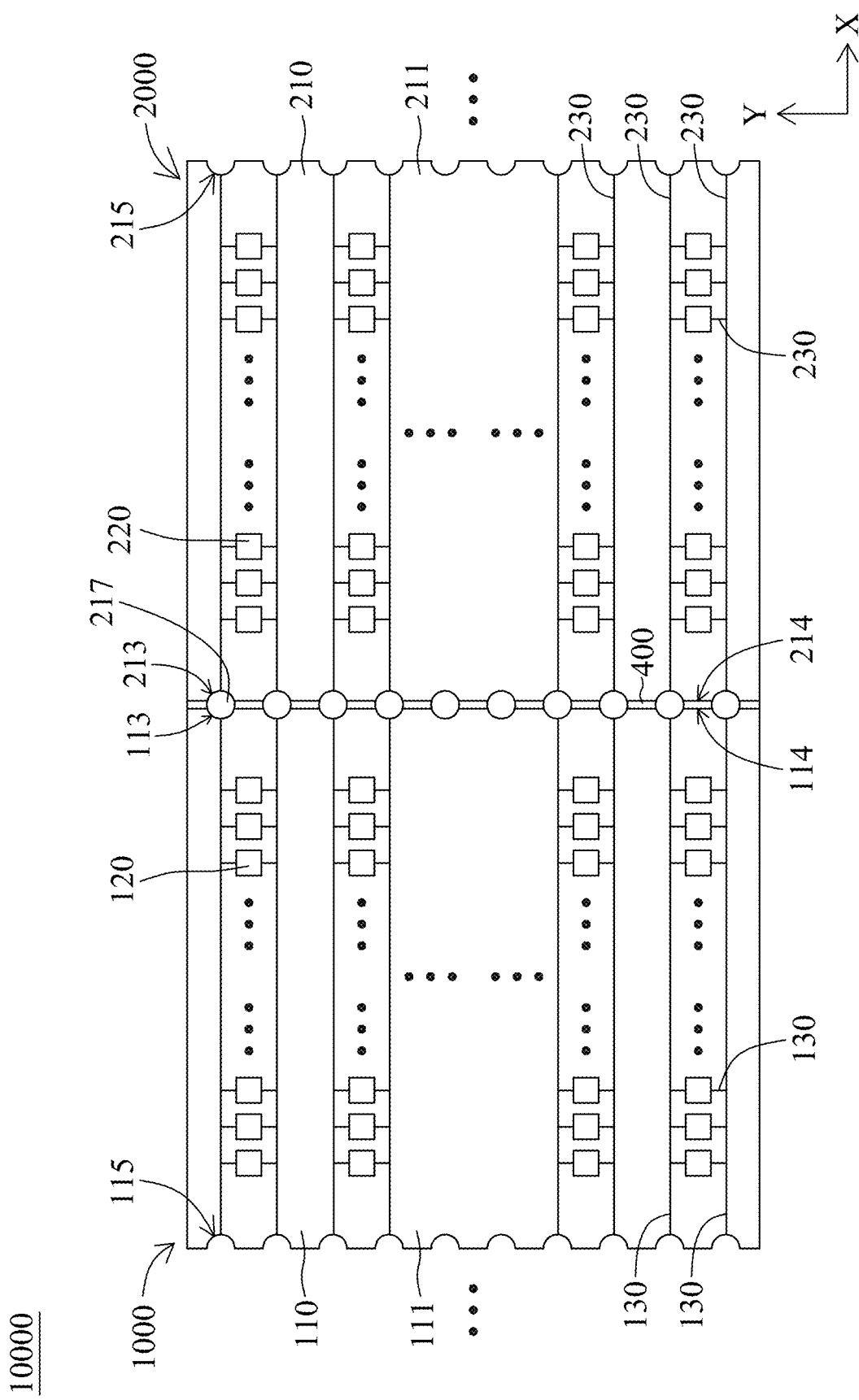
FIGS. 3A~3B show schematic diagrams of a process of manufacturing a light-emitting device in accordance with one embodiment of the present application.
Figure 3B:
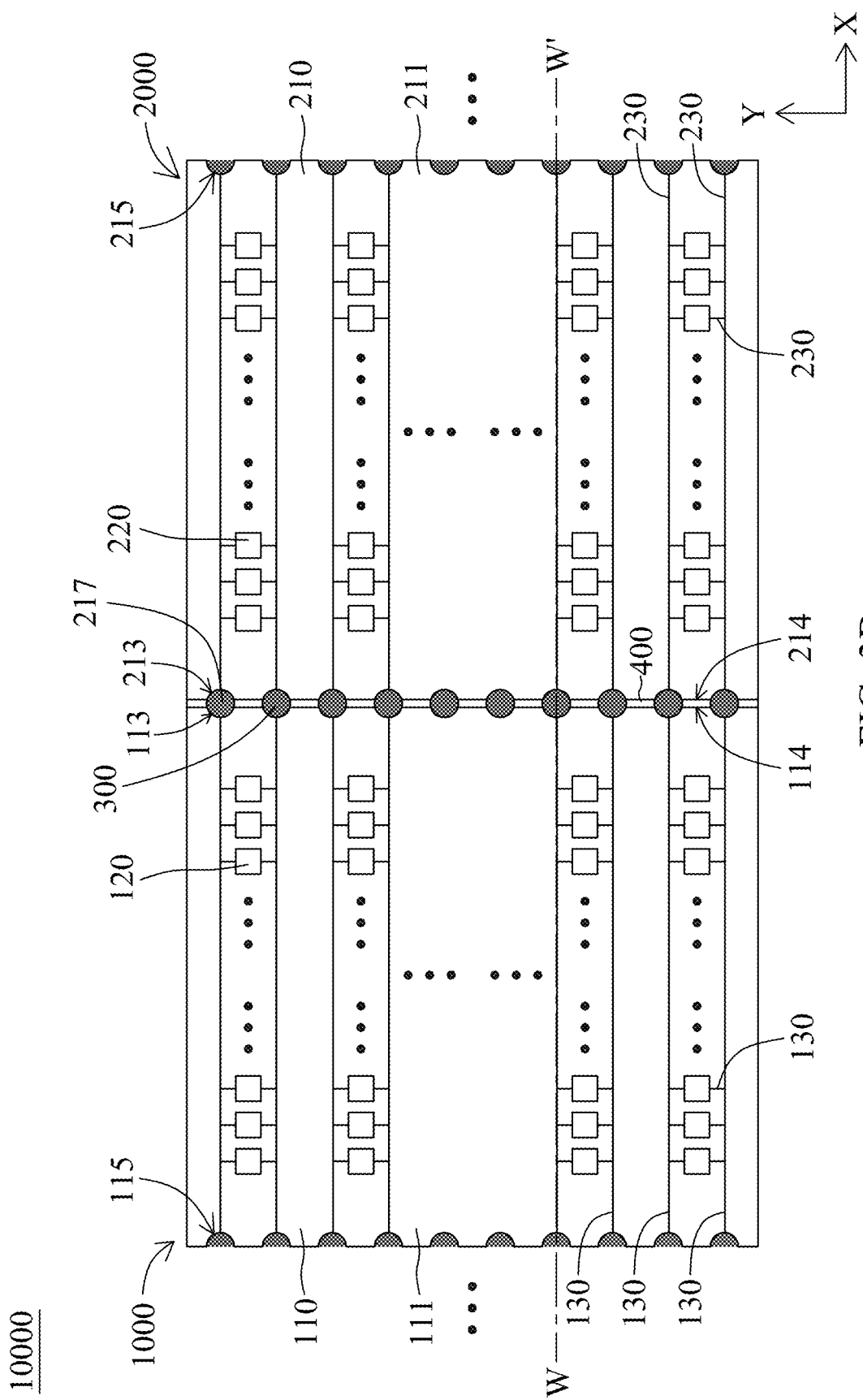

FIGS. 3A~3B show a manufacturing process of the light-emitting device 10000 in accordance with an embodiment of the present application. Referring to FIG. 3A, a first light-emitting module 1000 and a second light-emitting module 2000 are provided. The structure and manufacturing method of the second light-emitting module 2000 are similar to those of the first light-emitting module 1000. The related structure and manufacturing method can be referred to the previous paragraphs. As shown in FIG. 3A, during assembly, the first cavity 113 and the third cavity 213 form a joint through hole 217; the sidewall 114 is corresponding to the sidewall 214, and the insulation layer 400 covers the interface of the sidewall 114 and the sidewall 214 so that the first light-emitting module 1000 and the second light-emitting module 2000 are connected. In one embodiment, the insulation layer 400 includes insulating materials such as silicone, silicon dioxide, silicon glue, and epoxy resin. In the manufacture process of the first light-emitting module 1000, a part of the first substrate 110 and the first circuit 130 are removed to form the first cavities 113 and the second cavities 115 so that the first circuit 130 located on the first top surface 111 is adjacent to the first cavities 113 and the second cavities 115. Similarly, a part of the second substrate 210 and the second circuit 230 are removed to form the third cavities 213 and the fourth cavities 215 so that the second circuit 230 located on the second top surface 211 is adjacent to the third cavities 213 and the fourth cavities 215. In one embodiment, the insulation layer 400 is in contact with the first circuit 130 and/or the second circuit 230. In one embodiment, the insulation layer 400 extends into the first cavities 113 and/or the third cavities 213.

Referring to FIG. 3B, after assembling the first light-emitting module 1000 and the second light-emitting module 2000, the through holes 217 formed by the second cavities 113 and the third cavities 213 are filled with conductive materials to form columnar conductive layers 300. The columnar conductive layers 300 are in direct contact with the first and second circuits 130 and 230, so that the first light-emitting module 1000 and a second light-emitting module 2000 can be electrically connected to each other through the columnar conductive layer 300 to form the light-emitting device 10000. The light-emitting device 10000 may include a driving circuit (not shown) to control the first and second light-emitting components 120 and 220 in the first light-emitting module 1000 and the second light-emitting module 2000. The related description of the driving circuit can be referred to the previous paragraphs. Although only the first light-emitting module 1000 and the second light-emitting module 2000 are shown in the light-emitting device 10000 in FIG. 3B, the light-emitting device 10000 is not limited to two light-emitting modules. As mentioned above, with a similar bonding method applied to adjacent sidewalls, more light-emitting modules can be included. The shape of the light-emitting device 10000 can be rectangular, square, or irregular polygon. If the shape of the light-emitting device 10000 is rectangular, the aspect ratio can be 16:9, 14:9, 4:3, 3:2, 2.39:1, or 1.85:1. The size/shape of the light-emitting modules in the light-emitting device can be the same or different. In other words, the light-emitting device 10000 may further include a third light-emitting module (not shown) located at another side of the first light-emitting module 1000 opposite to the second light-emitting module 2000, and also connected to the first light-emitting module 1000 through the conductive layer and the insulation layer. Similarly, the light-emitting device 10000 may also include a fourth light-emitting module (not shown) located at another side of the second light-emitting module 2000 opposite to the first light-emitting module 1000, and also connected to the second light-emitting module 2000 through the conductive layer and the insulation layer. The structure and the manufacturing method of the third light-emitting module and the fourth light-emitting module are similar with those of the first light-emitting module 1000 and can be referred to the previous paragraphs.

FIG. 4A is a cross-sectional view of the light-emitting device shown in FIG. 3B. FIG. 4A shows a cross-sectional schematic diagram along the line W-W' in FIG. 3B. The conductive layer 300 in the first cavities 113 and the third cavities 213 protrudes above the first top surface 111 and the second top surface 211, and the conductive layer 300 directly contacts the first circuit 130 and the second circuit 230 to electrically connect the first light-emitting components 120 and the second light-emitting components 220. The conductive layer 300 has an uneven top surface 300A which can be higher than the first top surface 111 and the second top surface 211. In other words, the top surface 300A is not parallel or flush with the first top surface 111 or the second top surface 211.

As shown in FIGS. 3B and 4A, the first and second circuits 130 and 230 are located on the first top surface 111 and the second top surface 211 respectively. However, in other embodiments, the circuits can also be provided on other surfaces. FIG. 4B is a cross-sectional view of a light-emitting device in accordance with an embodiment of the present application. In FIG. 4B, a third circuit 131 is disposed under the first lower surface 112, and the third circuit 131 is electrically connected to the first and/or second circuits through the conductive layer 300. As shown in the figure, the conductive layer 300 has a protruding bottom surface and is connected to the third circuit 131. In the embodiment disclosed in FIG. 4B, the arrangement of the third circuit 131 allows other elements in the light-emitting device, such as active elements and/or passive elements included in the driving circuit described in the previous paragraphs, to be arranged under the first bottom surface 112 and being electrically connected to the first and second light-emitting components 120 and 220 on the first top surface 111 and the second top surface 211 through the third circuit 131 and the conductive layer 300. In other words, electronic components can be provided on the first top surface 111 and under the first bottom surface 112. Compared with the foregoing embodiments, in FIG. 4B, some or all of the non-light-emitting components can be disposed under the first bottom surface 112 so that the first top surface 111 and the second top surface 211 can accommodate more first light-emitting components 120 and second light-emitting components 220 to increase the arrangement density of the light-emitting components and to improve the luminous intensity of the light-emitting device. In other embodiments, a circuit (not shown) is also provided under the second bottom surface 212 of the second substrate 210 corresponding to the second top surface 211 and has the effect the same or similar to that of the third circuit 131. The related description can be referred to the previous paragraphs. In another embodiment, the third circuit 131 is not in direct contact with the conductive layer 300, but is electrically connected to the conductive layer 300 through a separate conductive structure in the first substrate 110, such as a metal wire (not shown). In one embodiment, the protruding lower surface of the conductive layer 300 is formed after the top surface 300A is formed. For example, after the top surface 300A of the conductive layer 300 is formed, the light-emitting module is turned over, and more conductive materials are covered on the reversed conductive layer 300 to form a protrusion protruding from the first lower surface 112 so that the light-emitting modules 120, 220 are electrically connected to the third circuit 131.

FIG. 4C is a cross-sectional view of the light-emitting device in accordance with one embodiment of the present application. In FIG. 4C, the first circuit 130 and the second circuit 230 are electrically connected to each other by a conductive structure 302. The conductive structure 302 includes a first part 3020 and a second part 3022 above the first part 3020, and the second part 3022 has a maximum width W1 at a cross-sectional view greater than the maximum width W2 of the first part 3020. The first part 3020 is all located within the through hole 217 and the second part 3022 is located above the upper surfaces 111, 211. The first part 3020 is in direct contact with the first substrate 110 and the second substrate 210, and the second part 3022 is in direct contact with the first circuit 130 and the second circuit 230. In one embodiment, there is an adhesive material such as silicone and epoxy resin (not shown) located between the first part 3020 and the first substrate 110 and/or the second substrate 210, and the adhesive material can strengthen the connection strength between the first part 3020 and the first substrate 110 and/or the second substrate 210. In one embodiment, the insulation layer (not shown) is in direct contact with the first part 3020. In another embodiment, there is a conductive adhesive material such as solder (not shown) located between the second part 3022 and the first circuit 130 and/or the second circuit 230. In one embodiment, the light-emitting device further includes a protective layer (not shown) covering and directly contacting the first and second light-emitting components 120, 220, the substrates 110, 210, and the conductive structure 302, and the protective layer is in direct contact with the portion the conductive device 302 protruding above the upper surfaces 111, 211, such as the upper surface and the side surfaces of the second part 3022. The protective layer is a light-transmissive material. In one embodiment, at least 40% of the light emitted by the first and second light-emitting components 120, 220 can pass through the protective layer without being absorbed.

In addition, the patterns of the circuits arranged on the upper and lower surfaces in FIG. 4B can also be applied to other embodiments, such as those in FIGS. 1, 2E, 3B, and 4C. The conductive structure 302 in FIG. 4C may also be applied to other embodiments, such as those in FIGS. 1 and 3B, to replace the conductive layer 300.

Figure 5A:
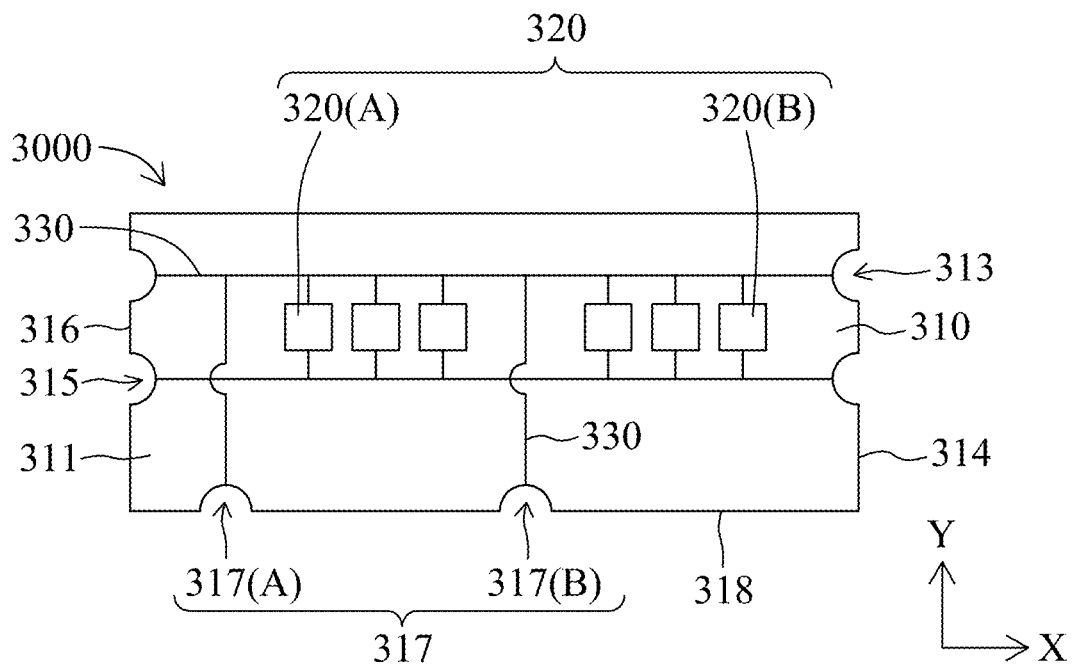
FIGS. 5A~5C show schematic diagrams of a light-emitting module in accordance with one embodiment of the present application.
Figure 5B:
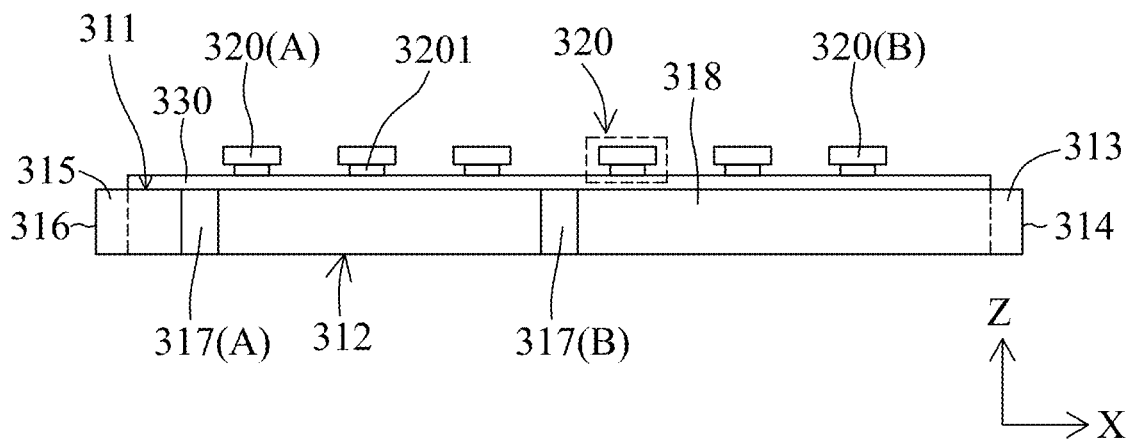
Figure 5C:
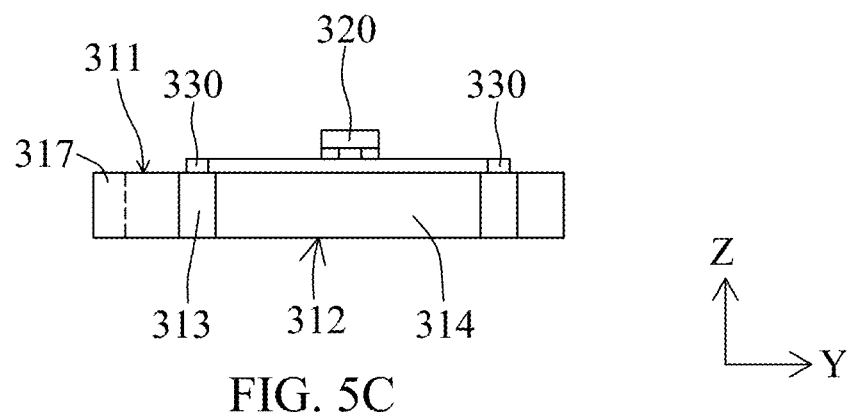

FIGS. 5A~5C are schematic diagrams of the light-emitting module 3000 in accordance with one embodiment of the present application. FIG. 5A shows the top view of the light-emitting module 3000 on the X-Y plane, while FIGS. 5B and 5C are the side views of the light-emitting module 3000 on the X-Z plane and on the Y-Z plane, respectively. Referring to FIG. 5A, the light-emitting module 3000 includes a third substrate 310, a third circuit 330, and a third light-emitting component 320 (such as light-emitting component 320A, 320B) arranged on the third substrate 310. The third substrate 310 includes a third top surface 311, a third bottom surface 312 (see FIG. 5B), a fifth cavity 313, a sixth cavity 315, a seventh cavity 317 (such as seventh cavity 317A, 317B), a third sidewall 314, a fourth sidewall 316, and a fifth sidewall 318. The fifth cavity 313, the sixth cavity 315, and the seventh cavity 317 are located at three different sides of the third substrate 310. The fifth cavity 313 is connected with the third sidewall 314, the sixth cavity 315 is connected with the fourth sidewall 316, and the seventh cavity 317 is connected with the fifth sidewall 318. The light-emitting module 3000 can be connected with other light-emitting modules (not shown) by the fifth cavity 313 and the third sidewall 314, electrically connected with other light-emitting modules through the conductive layer (not shown), and forming a light-emitting device such as the one shown in FIGS. 1 and 3B. Similarly, the light-emitting module 3000 can be connected with other light-emitting modules through the sixth cavity 315 and the fourth sidewall 316 and/or the seventh cavity 317 and the fifth sidewall 318. Similar to the manufacturing method disclosed in FIGS. 2A~2F, after the third circuit 330 is formed on the third substrate 310, portions of the third substrate 310 and the third circuit 300 are removed in order to form cavities 313, 315, 317, and the remaining third circuit 330 is located adjacent to cavities 313, 315, 317 on the third top surface 310. As mentioned in the previous paragraphs, unless otherwise noted in this specification, the symbol 320 represents multiple third light-emitting components 320, and the symbol 317 represents multiple seventh cavities 317, while a specific third light-emitting component 320 can be represented as 320A/B, and a specific seventh cavity 317 can be represented as 317A/B.

FIG. 5B shows a side view of the light-emitting module 3000 along the X-Z plane. More specifically, FIG. 5B shows a side view of the side where the seventh cavity 317 and the fifth sidewall 318 are located. As shown in FIG. 5B, the third light-emitting component 320 includes an electrode 3201. From the perspective of view, only one electrode 3201 in the third light-emitting component 320 is shown. However, the third light-emitting component 320 can have two or more electrodes to receive external power, and the third light-emitting component 320 is electrically connected to the third circuit 330 through the electrode 3201 and the conductive adhesive material such as solder (not shown). The inner surface of the seventh cavity 317 is smooth and connected to the fifth sidewall 318, while the third circuit 330 located on the third top surface is adjacent to the seventh cavity 317. In one embodiment, the inner surface of the seventh cavity 317 and/or the fifth sidewall 318 includes a graphical, non-smooth surface for strengthening the connection strength between the light-emitting module 3000 and other light-emitting modules. In other words, the non-smooth inner surface of the seventh cavity 317 and/or the non-smooth surface contained in the fifth sidewall 318 can increase the contact area between the substrate and the conductive layer (not shown) and/or the insulation layer (not shown), which is helpful to strengthen the connection strength between the light-emitting module 3000 and other light-emitting modules.

As shown in FIGS. 5A~5C, the third circuit 330 extends to three sidewalls (directions) of the third substrate 310 and is located on the third top surface 311 adjacent to the fifth cavity 313, the sixth cavity 315, and the seventh cavity 317. FIG. 5C shows a side view of the light-emitting module 3000 along the Y-Z plane. More specifically, FIG. 5C shows a side view of the side where the fifth cavity 313 and the third sidewall 314 are located. As shown in FIG. 5C, the inner surface of the fifth cavity 313 is smooth and connected to the third sidewall 314, while the third circuit 330 located on the third top surface 311 is adjacent to the fifth cavity 313. In one embodiment, the inner surface of the fifth cavity 313 and/or the third sidewall 314 is a graphical, non-smooth surface to strengthen the connection strength between the light-emitting module 3000 and other light-emitting modules. The related description can be referred to the previous paragraphs. The third circuit 330 located on the third top surface 311 extends to three sidewalls of the third substrate 310 and is adjacent to the fifth cavity 313, the sixth cavity 315, and the seventh cavity 317. In one embodiment, the light-emitting module 3000 includes a protective layer covering and directly contacting with the light-emitting component 320 and substrate 310, and the protective layer is a light-transmissive material. In one embodiment, at least 40% of the light emitted by the light-emitting component 320 can pass through the protective layer without being absorbed.

Figure 6:
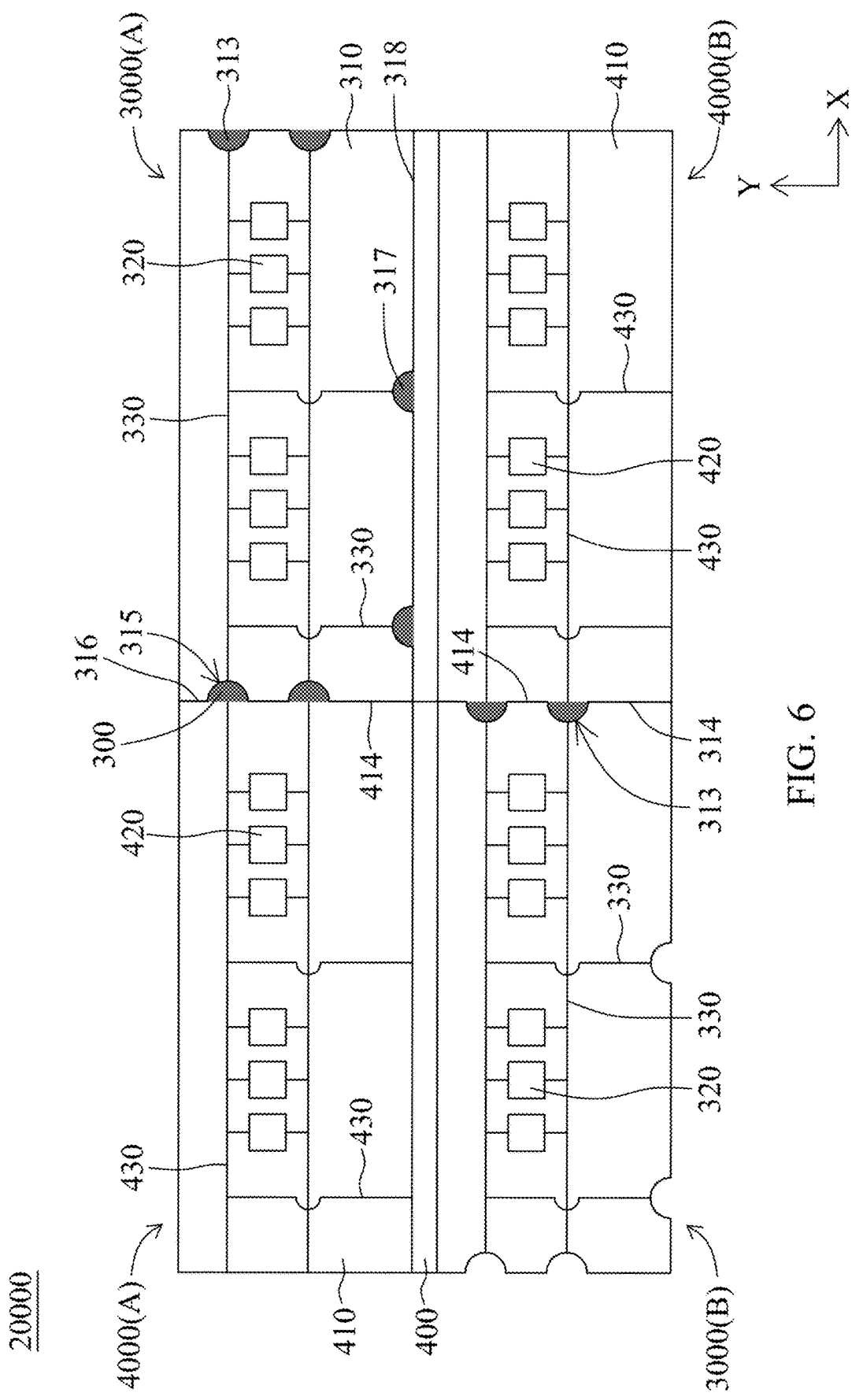
FIG. 6 shows a schematic diagram of a light-emitting device in accordance with one embodiment of the present application.

FIG. 6 shows a light-emitting device 20000 in accordance with one embodiment of the present application. Referring to FIG. 6, the light-emitting device 20000 includes a third light-emitting module 3000, a fourth light-emitting module 4000, and a conductive layer 300 which is used to connect the third light-emitting module 3000 and the fourth light-emitting module 4000, and an insulation layer 400. For simplicity, the symbol 3000 represents multiple third light-emitting modules 3000, and the symbol 4000 represents multiple fourth light-emitting modules 4000, and a specific third light-emitting module 3000 can be represented as 3000A, 3000B, a specific fourth light-emitting module 4000 can be represented as 4000A, 4000B. The manufacturing method and the structure of the fourth light-emitting module 4000 are similar to those of the first light-emitting module 1000. The related description can be referred to the previous paragraphs. The light-emitting module 4000 includes a fourth substrate 410, a fourth circuit 430, and a fourth light-emitting component 420 while the fourth circuit 430 and the fourth light-emitting component 420 are arranged on the fourth substrate 410. The fourth substrate 410 includes a sixth sidewall 414 surrounding the fourth substrate 410, and the sixth sidewall 414 is a smooth surface connected with the third light-emitting module 3000. In other embodiments, the sixth sidewall 414 includes a graphical non-smooth surface or a rough surface formed by a process such as breaking process in order to strengthen the connection strength between the light-emitting module 4000A and other light-emitting modules. The related description can be referred to the previous paragraphs.

In FIG. 6, the third light-emitting module 3000A and the fourth light-emitting module 4000A are electrically connected to each other through the conductive layer 300 in the sixth cavity 315, and the third light-emitting module 3000B and the fourth light-emitting module 4000B are electrically connected to each other through the conductive layer 300 in cavity 313. On the other hand, the third light-emitting module 3000B and the fourth light-emitting module 4000A, and the third light-emitting module 3000A and the fourth light-emitting module 4000B are connected to each other by an insulation layer 400. In one embodiment, the third light-emitting module 3000B is connected with the fourth light-emitting module 4000A at the side with cavities (not shown), and the third circuit 330 and the fourth circuit 430 extend to the position where the cavities are located and are electronically connected to each other through the conductive layer in the cavity (not shown). In one embodiment, the light-emitting device 20000 further includes a conductive connection structure such as a metal wire (not shown) located below the bottom surface of the light emitting modules 3000, 4000, and the circuits located under the bottom surface of the light-emitting modules 3000, 4000 can be electrically connected to the circuits 330, 430 located on the top surfaces thereof through the conductive connection structure, in order to provide an electrical connection between the third light-emitting module 3000B and the fourth light-emitting module 4000A (and/or the third light-emitting module 3000A and the fourth light-emitting module 4000B). In one embodiment, the side where cavities 313 of the third light-emitting module 3000 are located is connected to another light-emitting module, such as light-emitting module 3000 or light-emitting module 4000. In one embodiment, the side which is opposite to the side of the third light-emitting module 3000A connected to the fourth light-emitting module 4000B is connected to another light-emitting module, such as the light-emitting module 3000 or the light-emitting module 4000. In other words, the second light-emitting device 20000 may include more light-emitting modules 3000, 4000 connected to the light-emitting modules 3000A, 3000B, 4000A, 4000B in FIG. 6. In one embodiment, the light-emitting device 20000 further includes a protective layer covering and direct contacting with the light-emitting components 320, 420 and substrates 310, 410, and the protective layer is a light-transmissive material. In one embodiment, at least 40% of the light emitted by the light-emitting components 320, 420 can pass through the protective layer without being absorbed. In one embodiment, the third light-emitting module 3000A and the fourth light-emitting module 4000A can be connected by an insulation layer (not shown), and the insulation layer is in direct contact with the fourth sidewall 316 and the sixth sidewall 414. Similarly, in one embodiment, the third light-emitting module 3000B and the fourth light-emitting module 4000B may also be connected by an insulation layer (not shown) so that the insulation layer is in direct contact with the third sidewall 314 and the sixth sidewall 414.

In FIG. 6, cavities 313 and 315 are connected with the sixth sidewall 414 and the conductive layer 300 is located between cavities 313, 315 and sidewall 414. In one embodiment, the fourth light-emitting module 4000A has a cavity (not shown) in the position corresponding to the sixth cavity 315 at the sixth sidewall 414, and the cavity forms a through hole with the sixth cavity 315 as that shown in FIGS. 3A and 3B. A conductive layer 300 or a conductive device 302 can be formed in the through hole such as that in FIGS. 4A~4C to electrically connect the third light-emitting modules 3000A, 4000A. The related description of the through hole, the conductive layer, and the conductive device can be referred to the previous paragraphs. In another embodiment, the fourth light-emitting module 4000A has a protruding part (not shown) in the position corresponding to the sixth cavities 315 at the sixth sidewall 414, and the protruding part may have an approximate or different profile with the sixth cavity 315 but not fully filled with the corresponding sixth cavity 315 so that there is a gap between the protruding part and the sixth cavity 315 to accommodate the conductive layer 300. Similarly, in other embodiments, cavities (not shown) or protruding parts (not shown) can also be set at the side of the fourth light-emitting module 4000B opposite to the side where the fifth cavities 313 are located, and the conductive layer can be formed in the fifth cavity 313 and the cavity or between the fifth cavity 313 and the protruding part so that the fourth light-emitting module 4000B and the third light-emitting module 3000B can be electrically connected through the conductive layer 300. In one embodiment, the third light-emitting module 3000A or 3000B may be replaced by the fourth light-emitting module 4000 so that the light-emitting modules in the same row or column in the light-emitting device 20000 is composed of the same light-emitting modules. In contrast, in one embodiment, the fourth light-emitting module 4000A or 4000B can be replaced by the third light-emitting module 3000A or 3000B.

In other embodiments, the structure having the cavity connected to the sidewall or the structure having the cavity connected to the protruding part as shown in FIG. 6 can also be applied to the light-emitting device 10000 in FIGS. 1 and 3B so that the cavities 113 and the sidewall 214 (or the cavities 213 and the side wall 114) are connected to each other and the conductive materials are filled between the cavities and the sidewall, or protruding parts can be formed at the position corresponding to the cavities 113 (or cavities 213) so that the cavities and the protruding parts are connected correspondingly and the conductive materials are filled between the cavities and the protruding parts.

Figure 7A:
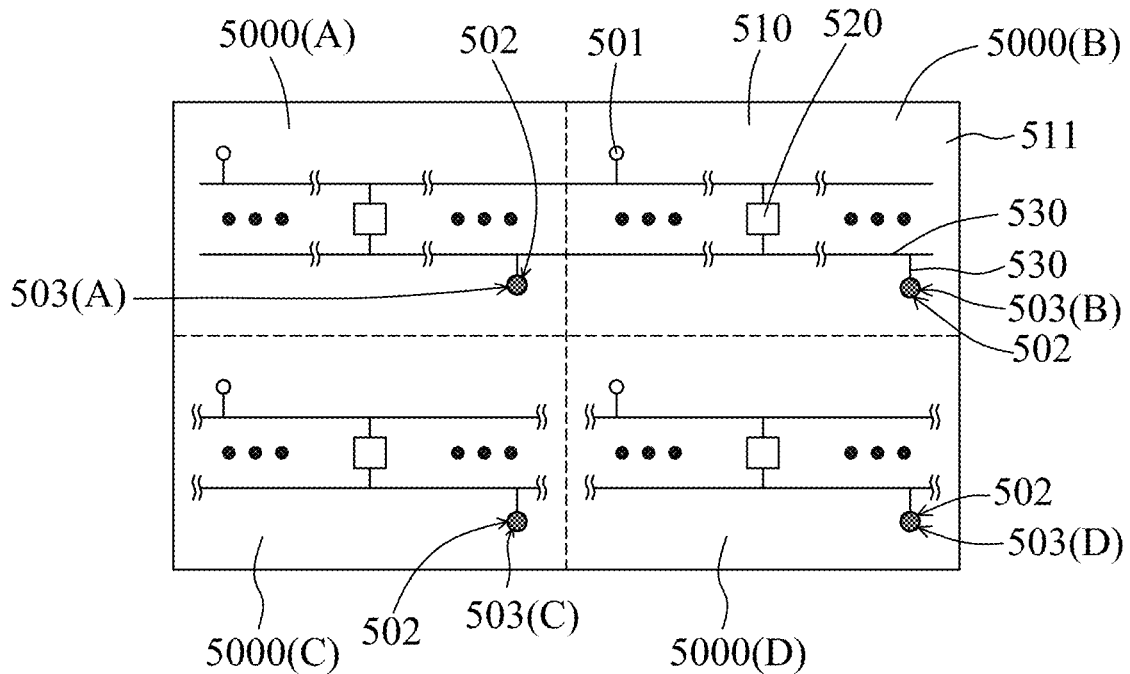
FIGS. 7A~7B show schematic diagrams of a light-emitting device in accordance with one embodiment of the present application.
Figure 7B:
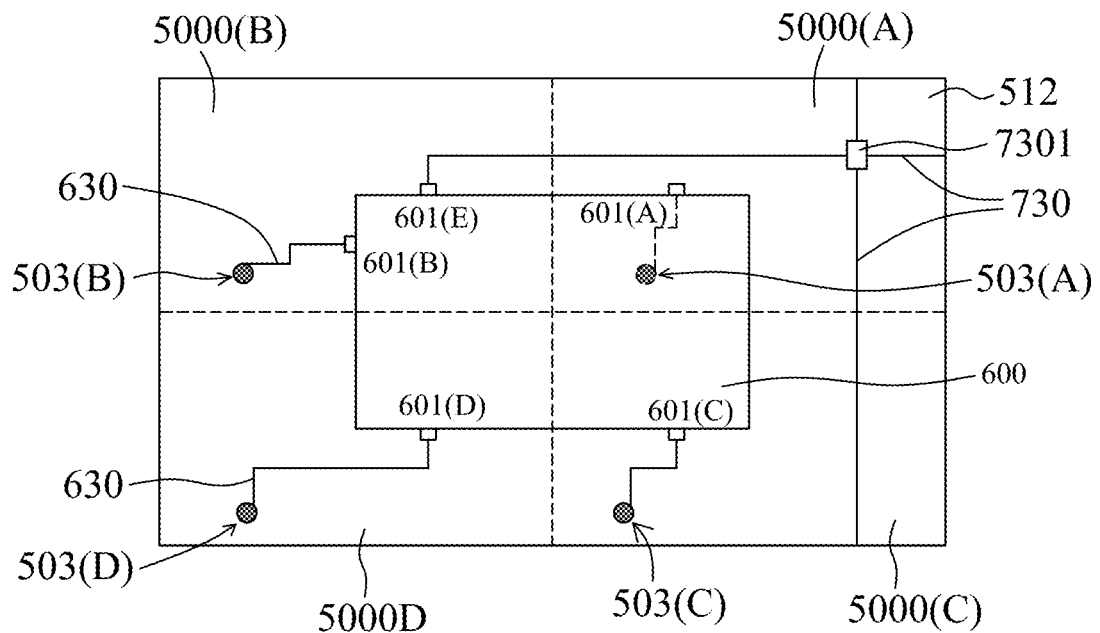

FIGS. 7A~7B show a light-emitting device 30000 in accordance with another embodiment of the present application. FIG. 7A shows a top view of the light-emitting device 30000. The light-emitting device 30000 includes multiple fifth light-emitting modules 5000 (such as the light-emitting module 5000A, 5000B, 5000C, 5000D) connected to one another through insulation layers (not shown) and conductive layers (not shown). Regarding the connection method between the fifth light-emitting modules 5000, it can be referred to FIGS. 1~6 and the related previous paragraphs in the specification.

As shown in FIG. 7A, each fifth light-emitting module 5000 includes a fifth substrate 510, a positive contact 501, a negative contact 502, and a conductive pillar 503 (such as conductive pillars 503A, 503B, 503C, 503D), a fifth circuit 530, and a fifth light-emitting components 520. The fifth substrate 510 includes a top surface 511 shown in FIG. 7A and a bottom surface 512 shown in FIG. 7B. The fifth circuit 530 and the fifth light-emitting component 520 are disposed on the top surface 511, and the fifth light-emitting component 520 is electrically connected to the positive electrical contact 501, the negative electrical contact 502, and the conductive pillar 503 through the fifth circuit 530, respectively. The conductive pillar 503 penetrates the fifth substrate 510 so that the fifth light-emitting component 520 on the top surface 511 can be electrically connected to the fifth circuit 530, the conductive pillar 503, and the driving chip 600 located under the bottom surface 512 shown in FIG. 7B. More specifically, a power supply device (not shown) is electrically connected to the fifth circuit 530 and the fifth light-emitting component 520 through the positive contact 501, and then electrically connected successively via the circuit 530, the negative contact 502, the conductive pillar 503, and the driving chip 600 to form a current loop. The power supply device provides power so that the fifth light-emitting component 520 can receive the control signal/current from the driving chip 600. The manufacturing method of the conductive pillar 503 is similar to the method of forming the conductive layer 300. The related description can be referred to the previous paragraphs.

In one embodiment, after forming a through hole penetrating the fifth substrate 510 in a manner similar to forming the conductive device 302, a preformed conductive structure is filled in the through hole to form the conductive pillar 503. In FIG. 7A, the light-emitting device 30000 includes light-emitting modules 5000A, 5000B, 5000C, and 5000D. Any or all of these light-emitting modules can be replaced by a light-emitting module including electrical contacts 501, 502 and conductive pillars 503, such as light-emitting modules 1000, 2000, 3000, 4000. In one embodiment, the light-emitting device 30000 further includes other light-emitting modules, such as light emitting modules 1000, 2000, 3000, 4000, 5000, connected to the light-emitting module 5000 shown in FIG. 7A. In one embodiment, the light-emitting device 30000 further includes a protective layer covering and directly contacting to the light-emitting component 520 and the substrate 510, and the protective layer is a light-transmissive material. In one embodiment, at least 40% of the light emitted by the light-emitting component 520 can pass through the protective layer without being absorbed.

FIG. 7B shows a bottom view of the light-emitting device 30000. The light-emitting device 30000 includes a driving chip 600 and circuits 630, 730 disposed under the bottom surface 512. The driving chip 600 includes a plurality of transistors (not shown), and these transistors output control signals or currents through the connection ports 601, such as the ports 601A, 601B, 601C, and 601D. The driving chip 600 can also be connected to other control chips (not shown) through the connection port 601E to receive control signals for changing the optical characteristics, such as the luminous intensity, activation or deactivation of the light-emitting component of the light-emitting module, and changing the characteristics (such as the intensity of the control signal or current, activation or deactivation of the transistor) of the control signal or current output by the transistor according to these control signals. Referring to FIG. 7B, the driving chip 600 is connected to the conductive pillar 503 through the circuit 630, provides the control signal or current which is output from the port 601A through the circuit 630 to the light-emitting module 5000A through the conductive pillar 503A, provides the control signal or current which is output from the port 601B through the circuit 630 to the light-emitting module 5000B through the conductive pillar 503B, provides the control signal or current which is output from the port 601C through the circuit 630 to the light-emitting module 5000C through the conductive pillar 503C, and provides the control signal or current which is output from the port 601D through the circuit 630 to the light-emitting module 5000D through the conductive pillar 503D. Moreover, these currents provided to each light-emitting module can be independently controlled. In one embodiment, the circuit 630 and the conductive pillars 503 are respectively electrically connected to each other through a conductive material (not shown) such as solder. On the other hand, the port 601E is connected to the circuit 730 to receive the control signal. Among them, the circuit 730 further includes a connection point 7301 for connecting circuits extending toward different directions. In other embodiments, the driving chip 600 and circuits 630 and 730 in FIG. 7B can be incorporated in the light-emitting devices 10000 and 20000.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
   a first light-emitting module, comprising a first substrate comprising a first cavity and a first sidewall;
   a second light-emitting module, comprising a second substrate comprising a second cavity corresponding to the first cavity and a second sidewall corresponding to the first sidewall;
   a light-emitting component, disposed on the first substrate;
   a conductive layer connecting the first cavity and the second cavity and electrically connected to the first light-emitting module and the second light-emitting module; and
   an insulation layer connected to the first sidewall and the second sidewall.

2. The light-emitting device according to claim 1, wherein the first substrate comprises a top surface and a bottom surface corresponding to the top surface, and the conductive layer is exhibited on the top surface or under the bottom surface.

3. The light-emitting device according to claim 2, further comprising a first circuit disposed on the top surface and adjacent to the first cavity.

4. The light-emitting device according to claim 3, wherein the first circuit is located at a position staggered with the first cavity.

5. The light-emitting device according to claim 2, further comprising a first circuit disposed on the top surface and a second circuit disposed under the bottom surface, and the first circuit is electrically connected to the second circuit.

6. The light-emitting device according to claim 1, further comprising a first circuit disposed on the first substrate and a second circuit disposed on the second substrate, and wherein the first circuit is electrically connected to the second circuit.

7. The light-emitting device according to claim 1, wherein the first cavity further comprises an inner surface and the inner surface is a non-smooth surface.

8. The light-emitting device according to claim 1, further comprising a protective layer covering and directly contacting with the light-emitting component, the first substrate, the second substrate, and the conductive layer.

9. The light-emitting device according to claim 1, wherein more than 80% of light emitted by the light-emitting component can pass through the insulation layer.

10. The light-emitting device according to claim 1, the first substrate comprising a top surface and a bottom surface, and wherein the light-emitting component is disposed on the top surface and a driving chip is disposed under the bottom surface so that the light-emitting component is controlled by the driving chip.

11. A light-emitting device, comprising:
a first light-emitting module, comprising a first substrate, and the first substrate comprising a cavity and a first sidewall, wherein the cavity comprises an inner surface, and the inner surface is a non-smooth surface;
a second light-emitting module, comprising a second substrate, and the second substrate comprising a second sidewall corresponding to the cavity and the first sidewall;
a light-emitting component disposed on the first substrate; and
a conductive layer, directly connected to the cavity and sidewalls, and electrically connected to the first light-emitting module and the second light-emitting module.

12. The light-emitting device according to claim 11, wherein the first substrate comprises a top surface and a bottom surface corresponding to the top surface, and the conductive layer is exposed on the top surface or under the bottom surface.

13. The light-emitting device according to claim 12, further comprising a first circuit disposed on the top surface and adjacent to the cavity.

14. The light-emitting device according to claim 13, wherein the first circuit is located at a position staggered with the cavity.

15. The light-emitting device according to claim 12, further comprising a first circuit disposed on the top surface and a second circuit disposed under the bottom surface, and the first circuit is electrically connected to the second circuit.

16. The light-emitting device according to claim 11, further comprising a first circuit disposed on the first substrate and a second circuit disposed on the second substrate, and wherein the first circuit is electrically connected to the second circuit.

17. The light-emitting device according to claim 11, further comprising a protective layer covering and directly contacting with the light-emitting component, the first substrate, the second substrate, and the conductive layer.

18. The light-emitting device according to claim 11, further comprising an insulation layer connected to the first sidewall and the second sidewall, and wherein more than 80% of light emitted by the light-emitting component can pass through the insulation layer.

19. The light-emitting device according to claim 11, the first substrate comprising a top surface and a bottom surface, and wherein the light-emitting component is disposed on the top surface and a driving chip is disposed under the bottom surface so that the light-emitting component is controlled by the driving chip.

* * * * *